United States Patent
Swaminathan et al.

(10) Patent No.: US 10,145,023 B2
(45) Date of Patent: Dec. 4, 2018

(54) METHODS FOR REDUCING DEPOSITS IN INGOT PULLER EXHAUST SYSTEMS

(71) Applicant: SunEdison, Inc., Maryland Heights, MO (US)

(72) Inventors: Tirumani N. Swaminathan, Creve Coeur, MO (US); Jihong Chen, Cincinnati, OH (US)

(73) Assignee: Corner Star Limited, Hong Kong (HK)

( * ) Notice: Subject to any disclaimer, the term of this patent is extended or adjusted under 35 U.S.C. 154(b) by 0 days.

(21) Appl. No.: 14/802,712

(22) Filed: Jul. 17, 2015

(65) Prior Publication Data

US 2017/0016141 A1    Jan. 19, 2017

(51) Int. Cl.
| | |
|---|---|
| *C30B 15/04* | (2006.01) |
| *C30B 15/00* | (2006.01) |
| *C30B 15/02* | (2006.01) |
| *C30B 27/02* | (2006.01) |
| *C30B 29/06* | (2006.01) |

(52) U.S. Cl.
CPC ............ *C30B 15/04* (2013.01); *C30B 15/00* (2013.01); *C30B 15/02* (2013.01); *C30B 27/02* (2013.01); *C30B 29/06* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,004,393 A | * | 12/1999 | Maeda | ............ C30B 15/20 117/200 |
| 8,317,919 B2 | | 11/2012 | Bender | |
| 2002/0174828 A1 | * | 11/2002 | Vasat | ............ C30B 29/06 117/90 |
| 2004/0112274 A1 | * | 6/2004 | Tsujimoto | ............ C03C 17/004 117/2 |
| 2012/0056135 A1 | | 3/2012 | DeLuca et al. | |
| 2015/0233014 A1 | * | 8/2015 | Luter | ............ C30B 15/12 117/31 |

FOREIGN PATENT DOCUMENTS

| | | |
|---|---|---|
| DE | 2939460 A1 | 4/1981 |
| EP | 0785298 A1 | 7/1997 |
| JP | 2011184213 | 9/2011 |
| JP | 2011184227 A | 9/2011 |
| WO | WO-2014039976 A1 * 3/2014 ............ C30B 15/02 |
| WO | 2014106080 A1 | 7/2014 |
| WO | 2014197672 A1 | 12/2014 |

OTHER PUBLICATIONS

International Search Report and Written Opinion issued in PCT/US2016/042433, dated Nov. 11, 2016 (12 pages).

* cited by examiner

*Primary Examiner* — Erin F Bergner
(74) *Attorney, Agent, or Firm* — Armstrong Teasdale LLP

(57) ABSTRACT

Production of silicon ingots in a crystal puller that involve reduction in the formation of silicon deposits on the puller exhaust system are disclosed.

20 Claims, 4 Drawing Sheets

US 10,145,023 B2

METHODS FOR REDUCING DEPOSITS IN INGOT PULLER EXHAUST SYSTEMS

FIELD OF THE DISCLOSURE

The field of the disclosure relates to production of silicon ingots in a crystal puller and, in particular, methods that reduce formation of silicon deposits on the puller exhaust system.

BACKGROUND

Silicon ingots may be grown by the so-called Czochralski process in which a silicon ingot is pulled upward from a melt of silicon in a crystal puller apparatus. The process may be a continuous process in which silicon is intermittently or continuously added to the crucible as polycrystalline chunks or as pre-melted silicon or may be a batch process in which the ingot is withdrawn until silicon within the crucible is consumed.

Crystal pulling may be performed in the presence of an atmosphere within a housing of the puller. In both batch and continuous Czochralski processes, a process gas inert relative to silicon such as argon is continually introduced into the housing and withdrawn through an exhaust system of the puller. As the process gas is withdrawn, compounds may deposit on the exhaust system piping which is at a lower temperature compared to the puller chamber. Such deposits are removed from the system which may require the puller to be taken out of operation thereby increasing processing cost.

A need exits for methods for producing silicon ingots that are characterized by reduced formation of deposits on the exhaust system of the puller.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for reducing the rate at which deposits form within the exhaust of an ingot puller. The ingot puller includes a crucible, a housing disposed around the crucible with the housing having an atmosphere therein. A dopant selected from the group consisting of indium and thallium is introduced into the silicon melt to reduce silicon oxide formation. A silicon ingot is withdrawn from the doped melt. The atmosphere is at a pressure of at least about 5 kPa while withdrawing the silicon ingot.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
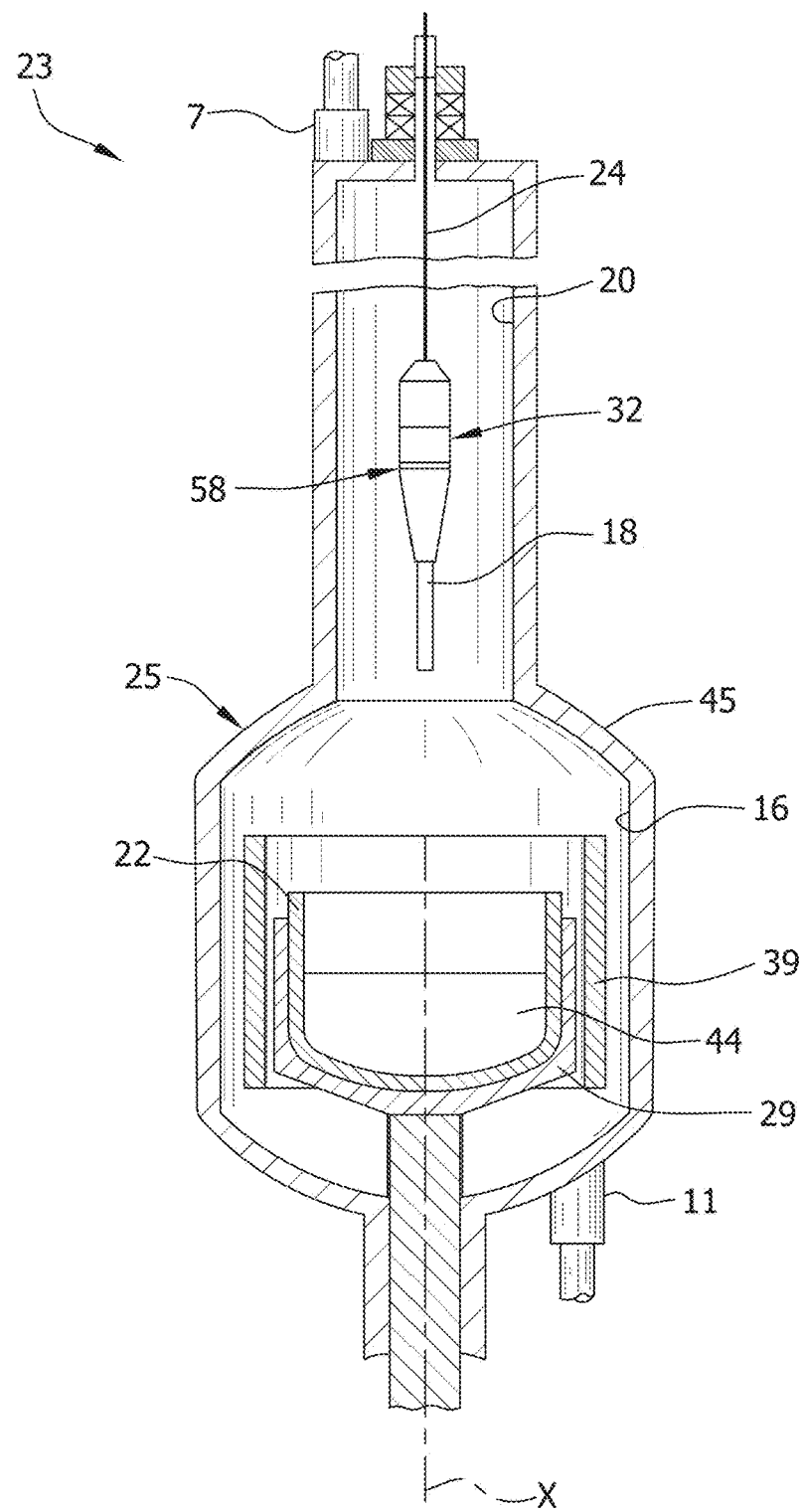
FIG. 1 is a schematic of a silicon ingot pulling apparatus.

Referring to FIG. 1, an ingot puller for pulling a silicon ingot according to a batch Czochralski method is designated by the reference numeral 23. The ingot puller 23 includes a housing 25 that defines a crystal growth chamber 16 and a pull chamber 20 having a smaller transverse dimension than the growth chamber. The growth chamber 16 has a generally dome shaped upper wall 45 transitioning from the growth chamber 16 to the narrowed pull chamber 20. The ingot puller 23 includes an inlet port 7 and an outlet port 11 which may be used to introduce and remove a process gas to and from the housing 25 during crystal growth.

A crucible 22 within the ingot puller 23 contains a silicon melt 44 from which a multicrystalline silicon ingot is drawn. The silicon melt 44 is obtained by melting polycrystalline silicon charged to the crucible 22. The crucible 22 is mounted on a turntable 29 for rotation of the crucible about a central longitudinal axis X of the ingot puller 23. In this regard, it should be understood that in certain embodiments, the crucible is not rotated.

The crucible 22 is also capable of being raised within the growth chamber 16 to maintain the surface of the melt 44 at a generally constant level as the ingot is grown. An electrical resistance heater 39 surrounds the crucible 22 for melting the silicon charge to produce the melt 44. The heater 39 is controlled by a control system (not shown) so that the temperature of the melt 44 is precisely controlled throughout the pulling process. Insulation (not shown) surrounding the heater 39 may reduce the amount of heat lost through the housing 25. The ingot puller 23 may also include a heat shield assembly (not shown) above the melt surface for shielding the ingot from the heat of the crucible 22 to increase the axial temperature gradient at the solid-melt interface.

A pulling mechanism (not shown) is attached to a pull wire 24 that extends down from the mechanism. The mechanism is capable of raising and lowering the pull wire 24. The ingot puller 23 may have a pull shaft rather than a wire, depending upon the type of puller. The pull wire 24 terminates in a pulling assembly 58 that includes a seed crystal chuck 32 which holds a seed crystal 18 used to grow the silicon ingot. In growing the ingot, the pulling mechanism lowers the seed crystal 18 until it contacts the surface of the silicon melt 44. Once the seed crystal 18 begins to melt, the pulling mechanism slowly raises the seed crystal up through the growth chamber 16 and pull chamber 20 to grow the silicon ingot. The speed at which the pulling mechanism rotates the seed crystal 18 and the speed at which the pulling mechanism raises the seed crystal (i.e., the pull rate v) are controlled by the control system. The general construction and operation of the ingot puller 23 is conventional and known by those of ordinary skill in the art.

The ingot puller may also be a continuous puller in which silicon is replenished continuously or intermittently while the ingot is being pulled from the melt. An exemplary continuous crystal puller is described and shown in U.S. Pat. No. 8,317,919, which is incorporated herein by reference for all relevant and consistent purposes. Silicon may be added to the continuous crystal puller in its solid state (e.g., silicon granules) in which case the silicon is melted in the crucible or silicon may be pre-melted and added to the crucible in its liquid form.

In both continuous and batch processes, a process gas is introduced through the inlet port 7 into the housing 25 and is withdrawn from the outlet port 11. The process gas creates an atmosphere within the housing and the melt and atmosphere form a melt-gas interface. The outlet port 11 is in fluid communication with an exhaust system (not shown) of the ingot puller. The exhaust system cools the process gas and may oxidize the gas and/or partially recycle the gas for further use.

The silicon ingot that forms in the batch or continuous crystal puller may be a single crystal silicon ingot. Alternatively, the ingot may have a multicrystalline structure (e.g., an average nominal crystal size of at least about 1 mm). The average nominal crystal grain size may be evaluated by observing the light reflectance in a wafer sliced from the silicon ingot. The crystal grains reflect the light in different directions due to the difference in crystal orientation between grains. The nominal distance between grain boundaries may be evaluated across the wafer and averaged.

The crucible 22 of the puller of FIG. 1 or the crucible used in continuous Czochralski processing may be composed of any suitable material such as quartz. The crucible 22 may be a clear-wall crucible or may be an opaque crucible containing bubbles. The particular dimensions of the crucible may be chosen by those of skill in the art based on the particular use of the crucible (e.g., ingot diameter, crystal puller dimensions, continuous or batch processing and the like).

To reduce formation of deposits on the piping of the ingot puller exhaust, a dopant selected from the group consisting of indium and thallium is introduced into the silicon melt. The dopant reduces formation of silicon oxide (SiO) in the melt. Silicon oxide is believed to evaporate from the melt and, upon cooling in the puller exhaust, forms silicon carbide (SiC), silicon oxide ($SiO_2$) and/or silicon oxycarbide ($SiO_xC_y$) deposits on the surfaces of the exhaust. Silicon oxide also contributes to oxidation of exhaust components and, particularly, graphite components (e.g., graphite heaters in the exhaust system). Such oxidation reduces the useful life of the components. Silicon oxide may also condense and form particles which can interfere with the growth of the crystal and degrade the lattice structure.

The dopant acts to reduce silicon oxide (SiO) formation by forming oxides with dissolved oxygen ($In_2O_3$, $Tl_2O$, $Tl_2O_3$, $TlO_2$, $Tl_4O_3$ and the like) in the melt, the dopant oxides evaporating from the melt quickly relative to silicon oxide, thereby reducing the amount of silicon oxide evaporated from the melt and present in the puller atmosphere. The increased evaporation rate may also allow the concentration of oxygen to be reduced in the melt which can improve the quality of the ingot.

In some embodiments, dopant is added at a rate at which the melt has a concentration of from about $1 \times 10^{15}$ atoms per $cm^3$ to about $1 \times 10^{20}$ atoms/$cm^3$. Alternatively or in addition, dopant is added at a rate such that the silicon melt has a resistivity (p-type or n-type) of about 0.01 ohm-cm to about 6 ohm-cm or from about 0.5 ohm-cm to about 6 ohm-cm. Combinations of dopants may be added in which case the total amount of dopant is added in an amount to achieve the various concentrations and/or resistivities recited above. The dopant may be relatively pure and, as in some embodiments, has a purity of at least about 99.999 wt % or at least about 99.9999 wt % or even more.

The atmosphere in the ingot puller housing may be at an increased pressure relative to conventional methods in which dopant is not used to suppress the rate of oxygen evaporation. The increase in pressure suppresses oxide formation including the total carbon monoxide (CO) that forms, carbon monoxide contributing to production of silicon carbide (SiC) deposits upon contact with graphite components such as graphite heaters and/or formation of silicon oxycarbide ($SiO_xC_y$) deposits. The increase in pressure also acts to decrease oxygen evaporation and counterbalances the use of dopant (which increases evaporation) which allows an ingot with substantially similar crystal quality to be produced relative to methods that do not involve use of dopant. In this regard, the methods of the present disclosure should not be limited to a particular mode of operation or effect.

In some embodiments, the atmosphere in the ingot puller housing is at least about 5 kPa while withdrawing the silicon ingot. In other embodiments the atmosphere is at a pressure of at least about 7 kPa while withdrawing the silicon ingot or at least about 9 kPa, at least about 11 kPa or at least about 13 kPa (e.g., from about 5 kPa to about 15 kPa, from about 5 kPa to about 13 kPa, from about 7 kPa to about 15 kPa or from about 9 kPa to about 15 kPa) while withdrawing the silicon ingot.

Generally, the pressure is maintained at the ranges stated above for the majority of the crystal growth process (e.g., at least about 80% of the crystal growth process or at least about 90%, at least about 95%, at least about 99% or even the entire crystal growth process). As used herein, the "crystal growth process" refers to growth of the body of the ingot, i.e., after neck growth and before the tail of the ingot is formed. In some embodiments, the pressure is ramped up to the stated range during neck growth and throughout growth of the body of the ingot.

In some embodiments, the pressure in the housing is adjusted to offset the increased oxygen evaporation caused by dopant addition. This allows the rate of oxygen evaporation and oxygen dissolution from the crucible to remain generally unchanged. In some embodiments, a baseline pressure for withdrawing the silicon ingot from the melt without dopant being introduced into the melt is established. Addition of dopant (or an increase in dopant addition) is commenced to reduce deposit formation in the exhaust system which increases the rate of oxygen evaporation of the melt. The pressure of the atmosphere is increased to offset an increase in oxygen evaporation from the melt caused by addition of dopant into the melt.

Dopant may be added to reduce formation of deposits on the puller exhaust in either a batch or a continuous Czochralski process. In batch processes, dopant is added before formation of the ingot and dopant may be added before or after melt formation or even during growth of the neck or body of the ingot. In continuous processes, dopant is added continually or intermittently into the crucible. In both batch and continuous processes, the process gas is continually introduced into the housing and a spent gas is withdrawn through an exhaust system of the puller. When P-type growth is desired, boron, gallium or aluminum may be used in addition to the indium or thallium to achieve the desired resistivity. When N-type growth is desired, phosphorus, arsenic or antimony may be used in addition to indium or thallium in an amount to compensate for the indium or thallium addition.

EXAMPLES

The processes of the present disclosure are further illustrated by the following Examples. These Examples should not be viewed in a limiting sense.

Example 1: Effect of Indium on Puller Exhaust Deposits

Figure 2:
FIGS. 2-3 are photographs of the exhaust system entrance piping with boron dopant.
Figure 3:
Figure 4:
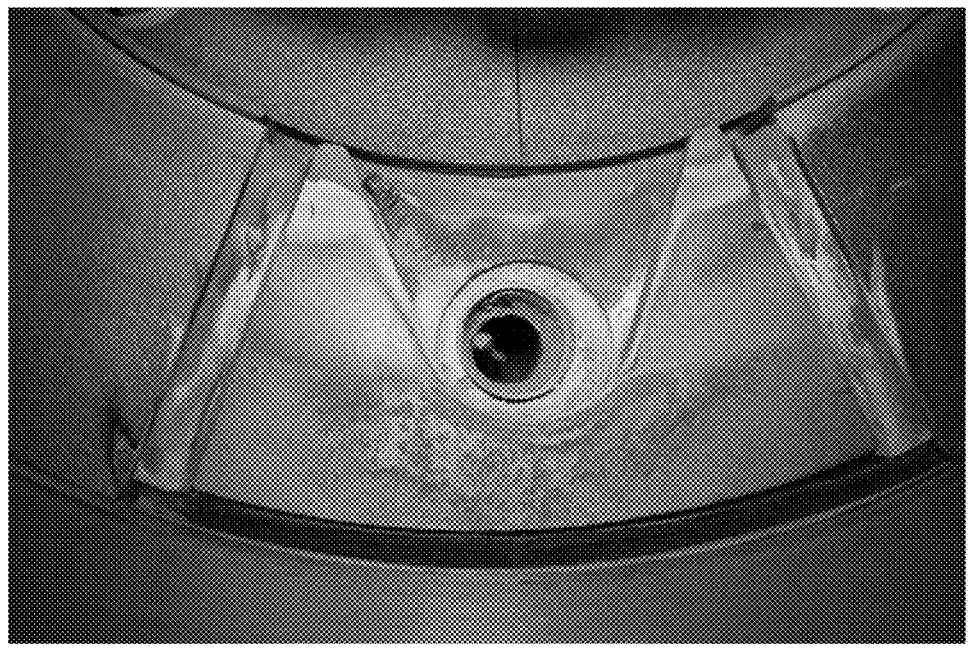
FIGS. 4-5 are photographs of the exhaust system entrance piping with indium dopant.
Figure 5:

In a continuous Czochralski pulling process, boron dopant was replaced with indium to achieve an ingot resistivity of from 0.5 ohm-cm to 6 ohm-cm. The system pressure was about 8 kPa for each run compared to a 3 kPa conventional system pressure. The exhaust tube entrance during normal operation (e.g., with boron as the dopant) is shown in FIGS. 2 and 3 and the tube entrance with indium as the dopant is shown in FIGS. 4 and 5. As may be seen from the Figures, use of indium significantly reduced deposits on the exhaust tube.

Figure 6:
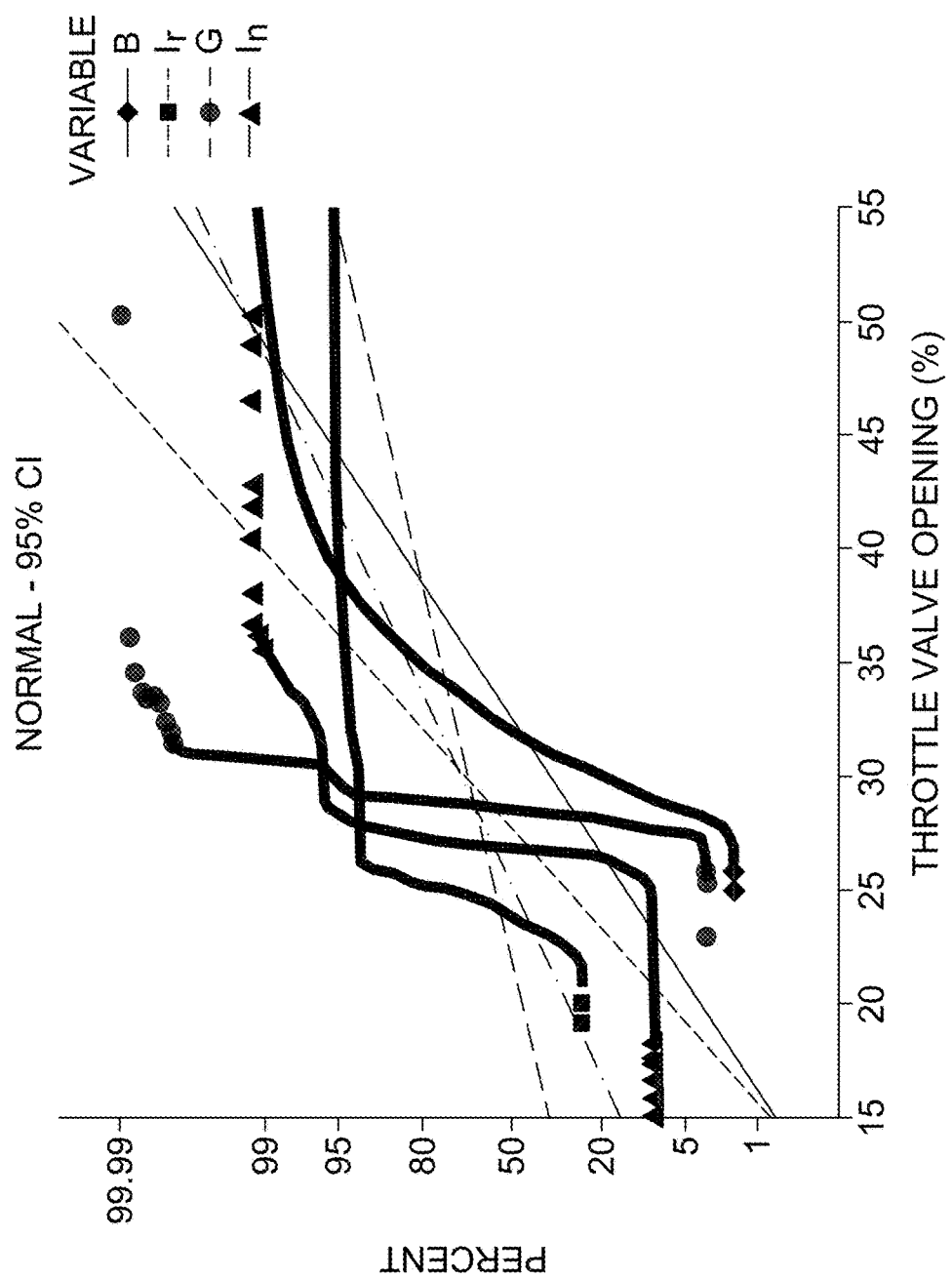
FIG. 6 is a graph showing the throttle valve opening for boron and indium doping runs.

FIG. 6 shows the throttle valve opening during ingot production (as a percentage of total operating time) for indium-doped runs compared with conventional boron-doped runs. The throttle opens to compensate for clogging to provide the same gas flow. As can be seen from FIG. 6, the indium-doped runs used smaller throttle openings during the majority of ingot growth compared to boron-doped runs which indicates less formation of deposits on the exhaust with use of indium.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for reducing the rate at which deposits form within the exhaust of an ingot puller, the ingot puller comprising a crucible having a silicon melt therein, a housing disposed around the crucible, the housing having an atmosphere therein, the method comprising:
   introducing a first dopant into the silicon melt to achieve a desired silicon ingot resistivity, the first dopant being selected from the group consisting of boron, phosphorous, arsenic and antimony;
   introducing a second dopant selected from the group consisting of indium and thallium into the silicon melt to reduce silicon oxide formation, the second dopant being different from the first dopant; and
   withdrawing a silicon ingot from the doped melt within the crucible, the atmosphere being at a pressure of at least about 5 kPa while withdrawing the silicon ingot, the crucible being made of quartz with quartz contacting the silicon melt such that oxygen dissolves from the quartz and enters the silicon melt, wherein, when the second dopant is indium, indium reacts with oxygen dissolved from the quartz crucible to form one or more indium oxides to reduce silica oxide formation and, when the second dopant is thallium, thallium reacts with oxygen dissolved from the quartz crucible to form one or more thallium oxides to reduce silica oxide formation.

2. The method as set forth in claim 1 further comprising:
   introducing a process gas into the housing; and
   withdrawing a spent process gas from the housing, the spent process gas passing through an exhaust system of the ingot puller during withdrawal.

3. The method as set forth in claim 1 wherein the second dopant reacts with oxygen to form an oxide in the melt.

4. The method as set forth in claim 1 wherein the atmosphere is at a pressure of at least about 7 kPa while withdrawing the silicon ingot.

5. The method as set forth in claim 1 further comprising:
   establishing a baseline pressure for withdrawing the silicon ingot from the melt without second dopant being introduced into the melt;
   commencing addition of second dopant into the melt to reduce silicon oxide formation; and
   increasing the pressure of the atmosphere above the baseline pressure to offset an increase in oxygen evaporation from the melt caused by addition of second dopant into the melt.

6. The method as set forth in claim 1 wherein silicon is not added to the melt after the melt is formed.

7. The method as set forth in claim 1 further comprising replenishing the silicon melt by adding silicon to the crucible.

8. The method as set forth in claim 1 wherein the first and/or second dopant is added at a rate to produce a silicon ingot with a resistivity of about 0.01 ohm-cm to about 6 ohm-cm.

9. The method as set forth in claim 1 wherein the atmosphere is at the recited pressure during at least about 80% of the crystal growth process.

10. The method as set forth in claim 1 wherein the atmosphere is at a pressure of at least about 13 kPa while withdrawing the silicon ingot.

11. The method as set forth in claim 1 wherein the first and/or second dopant is added at a rate to produce a silicon ingot with a resistivity of about 0.5 ohm-cm to about 6 ohm-cm.

12. The method as set forth in claim 1 wherein the quartz crucible contains at least about 90 wt % silica.

13. The method as set forth in claim 1 wherein the quartz crucible contains at least about 99 wt % silica.

14. The method as set forth in claim 1 wherein the atmosphere is at the recited pressure during at least about 95% of the crystal growth process.

15. The method as set forth in claim 1 wherein the atmosphere is at the recited pressure during the entire crystal growth process.

16. The method as set forth in claim 1 wherein the first dopant is boron to achieve P-type growth.

17. The method as set forth in claim 1 wherein the atmosphere is controlled to be the same pressure while withdrawing the silicon ingot.

18. The method as set forth in claim 1 wherein, when the second dopant is indium, the indium oxide is $In_2O_3$ and, when the second dopant is thallium, the thallium oxides are selected from the group consisting of $Tl_2O$, $Tl_2O_3$, $TlO_2$ and $Tl_4O_3$.

19. The method as set forth in claim 1 wherein the second dopant is indium.

20. The method as set forth in claim 1 wherein the second dopant is thallium.

* * * * *